(12) United States Patent
Morimoto et al.

(10) Patent No.: US 7,499,502 B2
(45) Date of Patent: Mar. 3, 2009

(54) AMPLIFIER, INFORMATION COMMUNICATION APPARATUS AND AMPLIFICATION METHOD

(75) Inventors: Shigeru Morimoto, Osaka (JP); Hisashi Adachi, Osaka (JP); Toru Matsuura, Osaka (JP)

(73) Assignee: Panasonic Corporation, Osaka (JP)

( * ) Notice: Subject to any disclaimer, the term of this patent is extended or adjusted under 35 U.S.C. 154(b) by 254 days.

(21) Appl. No.: 11/385,479

(22) Filed: Mar. 21, 2006

(65) Prior Publication Data

US 2006/0159198 A1    Jul. 20, 2006

Related U.S. Application Data

(63) Continuation of application No. PCT/JP2005/008073, filed on Apr. 27, 2005.

(30) Foreign Application Priority Data

Apr. 27, 2004    (JP)    ............... 2004-132006

(51) Int. Cl.
*H04K 1/02* (2006.01)
*H04L 25/03* (2006.01)
*H04L 25/49* (2006.01)

(52) U.S. Cl. .............. 375/297; 330/133; 330/134; 330/135; 330/136

(58) Field of Classification Search ........ 375/297; 330/133–136
See application file for complete search history.

(56) References Cited

U.S. PATENT DOCUMENTS

| 6,256,482 B1 | 7/2001 | Raab |
| 6,366,177 B1 | 4/2002 | McCune et al. |
| 6,392,258 B1* | 5/2002 | Hirata et al. ............ 257/197 |
| 7,109,791 B1 | 9/2006 | Epperson et al. |
| 2002/0177420 A1* | 11/2002 | Sander et al. ............ 455/108 |
| 2004/0061555 A1* | 4/2004 | Lynch ............ 330/136 |
| 2004/0071225 A1 | 4/2004 | Suzuki et al. |
| 2004/0185803 A1* | 9/2004 | Tanabe et al. ............ 455/108 |

FOREIGN PATENT DOCUMENTS

| JP | 3-285404 | 12/1991 |
| JP | 2004-104194 | 4/2004 |

OTHER PUBLICATIONS

International Search Report corresponding to International Application No. PCT/JP2005/008073 dated Aug. 23, 2005.

* cited by examiner

*Primary Examiner*—Curtis B Odom
(74) *Attorney, Agent, or Firm*—RatnerPrestia (57) ABSTRACT

An amplifier includes a modulation coder receiving an original modulation signal and generating an amplitude signal and a phase signal, a voltage adjusting instrument which generates an amplitude modulation signal from the amplitude signal, a carrier generator generating a phase modulation signal from the phase signal, and an amplification device receiving the phase modulation signal and the amplitude modulation signal serving as a bias voltage and outputting a modulation signal obtained by restoring and amplifying the original modulation signal. The voltage adjusting instrument determines a DC offset voltage on the basis of a level control signal indicating the level of the amplitude modulation signal and generates the amplitude modulation signal to which the DC offset voltage is added.

8 Claims, 6 Drawing Sheets

AMPLIFIER, INFORMATION COMMUNICATION APPARATUS AND AMPLIFICATION METHOD

This application is a continuation of International Application PCT/JP2005/008073, filed April 27, 2005, the contents of which are incorporated herein by reference.

BACKGROUND OF THE INVENTION

1. Field of the Invention

The present invention relates to an amplifier, an information communication apparatus and an amplification method of carrying out polar modulation, and more particularly, to an amplifier, an information communication apparatus and an amplification method of carrying out polar modulation while operating at high frequencies.

2. Related Art of the Invention

Battery life is a big problem for portable terminals, such as portable telephones. In particular, the amplifier in the transmission section of a wireless circuit consumes large power, affecting battery life significantly. Polar modulation is available as method of reducing the power consumption of the amplifier.

Figure 7:
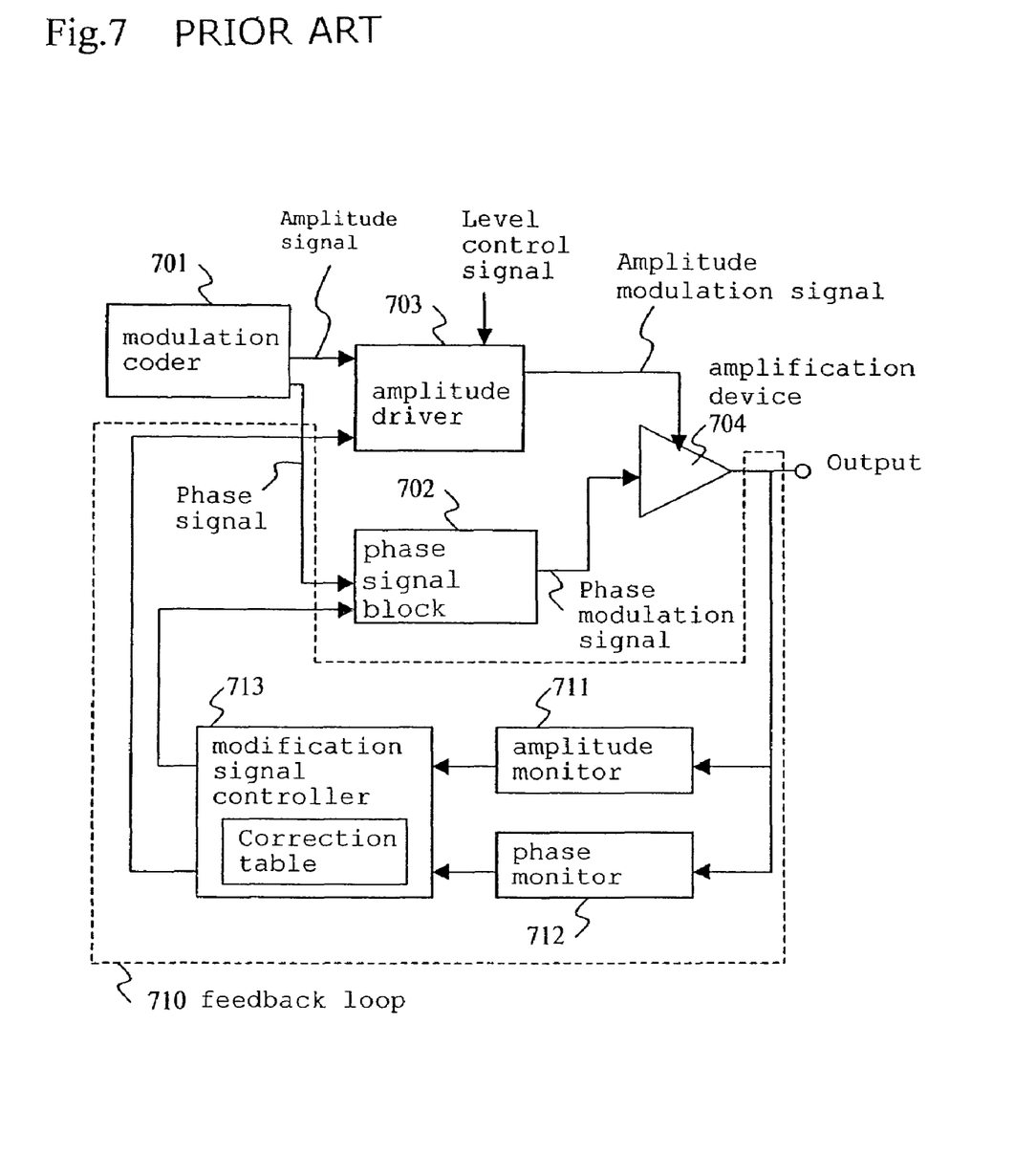
FIG. 7 is a view of the configuration of the conventional amplifier of carrying out polar modulation.

FIG. 7 shows the configuration of a conventional amplifier of carrying out polar modulation (refer to the Description of U.S. Pat. No. 6,366,177, for example). The conventional amplifier of carrying out polar modulation will be described below referring to FIG. 7.

The conventional amplifier comprises a modulation coder 701, a phase signal block 702, an amplitude driver 703, an amplification device 704, an amplitude monitor 711, a phase monitor 712 and a modification signal controller 713. The amplitude monitor 711, the phase monitor 712 and the modification signal controller 713 form a feedback loop 710.

The modulation coder 701 is a circuit of generating a phase signal and an amplitude signal. The phase signal block 702 is a circuit capable of phase modulation. The amplitude driver 703 is a circuit of receiving the amplitude signal and a level control signal, and generating an amplitude modulation signal from the amplitude signal according to the level control signal input. The amplification device 704 is a circuit of mixing the phase modulation signal with the amplitude modulation signal and simultaneously generating and amplifying a modulation signal.

In addition, the amplitude monitor 711 is a circuit of monitoring the amplitude of the modulation signal output from the amplification device 704 and outputting an amplitude signal. The phase monitor 712 is a circuit of monitoring the phase of the modulation signal output from the amplification device 704 and outputting a phase signal. The modification signal controller 713 is a circuit of controlling the amplitude driver 703 and the phase signal block 702 according to correction tables.

Next, the operation of the conventional amplifier having this configuration will be described.

The modulation coder 701 codes data or signals, such as sound, characters and images, input from the outside, and generates a phase signal and an amplitude signal.

The phase signal generated by the modulation coder 701 is input to the phase signal block 702 capable of phase modulation. Then, the phase signal block 702 carries out phase modulation using the phase signal input and generates a phase modulation signal. The phase modulation signal output from the phase signal block 702 is input to the amplification device 704 and amplified by the amplification device 704.

On the other hand, the amplitude signal generated by the modulation coder 701 is input to the amplitude driver 703. Furthermore, the amplitude driver 703 receives a level control signal simultaneously. The amplitude driver 703 generates an amplitude modulation signal according to the amplitude signal and the level control signal, and inputs the signal to the power supply of the amplification device 704.

In the amplification device 704, the phase modulation signal is mixed with the amplitude modulation signal, and a modulation signal is generated and amplified simultaneously. If the power consumption of the amplitude driver 703 can be reduced, the amplifier can obtain high operation efficiency.

Generally speaking, the amplification device 704 responds linearly to the phase modulation signal and the amplitude modulation signal; as a result, a distortion is generated in the modulation signal generated and amplified by the amplification device 704. Hence, a method of compensating for the distortion using the feedback loop 710 is adopted.

In the feedback loop 710, the modulation signal output from the amplification device 704 is monitored by the phase monitor 712 and the amplitude monitor 711 and branched into a phase signal and an amplitude signal. The phase signal and the amplitude signal branched are input to the modification signal controller 713. The modification signal controller 713 controls the amplitude driver 703 and the phase signal block 702 according to the correction tables, and adjusts the amplitude modulation signal and the phase modulation signal output from the amplitude driver 703 and the phase signal block 702, respectively, so that the modulation signal output from the amplification device 704 is not distorted.

In the case that a semiconductor transistor is used as the amplification device, it has large nonlinearity. The conventional method of correcting the distortion of the modulation signal, shown in FIG. 7, leads to the increase in circuit size and cost, and makes distortion compensation at speed sufficient for modulation speed difficult. Furthermore, if the compensation amount of the modulation signal at the modification signal controller 713 is large, the size of the correction tables becomes large, causing a problem of increasing memory size.

In other words, for the purpose of reducing the distortion of the modulation signal output from the amplification device, there is a problem that the increase in circuit size and cost cannot be avoided.

Furthermore, in the case that a heterojunction bipolar transistor or the like is used as the amplification device, the minimum collector voltage of generating the output power, that is, the threshold value of the collector voltage, changes with temperature; as a result, the distortion of the modulation signal output from the amplification device increases.

More specifically, in the case that a semiconductor transistor, such as a heterojunction bipolar transistor, is used as the amplification device, there is a problem that the distortion of the modulation signal is generated owing to temperature change.

For the purpose of solving the conventional problems described above, an object of the present invention is to provide an amplifier, an information communication apparatus and an amplification method of reducing the distortion of the modulation signal output from an amplification device while suppressing the increase in circuit size and cost.

Furthermore, another object of the present invention is to provide an amplifier, an information communication apparatus and an amplification method capable of reducing the distortion of the modulation signal owing to the change in the temperature of the amplification device.

SUMMARY OF THE INVENTION

In order to solve the above problems, a first aspect of the present invention is an amplifier of carrying out polar modulation by inputting amplitude data and phase data generated respectively by coding data or signals, comprising:

voltage adjusting instrument which generates an amplitude modulation signal from said amplitude data on the basis of a level control signal indicating the level of said amplitude modulation signal, a phase modulator of generating a phase modulation signal from said phase data, and an amplification device having an input terminal to which said phase modulation signal is input and a power supply terminal to which said amplitude modulation signal is input and outputting a modulation signal subjected to polar modulation using said phase modulation signal input and said amplitude modulation signal input, wherein said voltage adjusting instrument determines a DC offset voltage on the basis of said level control signal and generates said amplitude modulation signal to which said DC offset voltage determined is added.

Furthermore, a second aspect of the present invention is an amplifier according to the first aspect of the present invention, further comprising gain adjusting instrument which adjusts the level of said phase modulation signal generated by said phase modulator, wherein said phase modulation signal, the level of which is adjusted, is input to said input terminal.

Furthermore, a third aspect of the present invention is an amplifier according to the second aspect of the present invention, wherein said gain adjusting instrument determines the output level of said phase modulation signal on the basis of said level control signal and adjusts the level of said phase modulation signal generated by said phase modulator so that said phase modulation signal generated by said phase modulator has said output level determined.

Furthermore, a fourth aspect of the present invention is an amplifier according to the first aspect of the present invention, wherein said voltage adjusting instrument determines said DC offset voltage on the basis of said level control signal so that the relationship between the voltage level of said modulation signal generated and the voltage level of said amplitude signal becomes a linear relationship at least in part of the region.

Furthermore, a fifth aspect of the present invention is an amplifier according to the first aspect of the present invention, wherein said voltage adjusting instrument changes said DC offset voltage on the basis of said level control signal so that the relationship between the voltage level of said modulation signal amplified and the voltage level of said amplitude signal becomes a substantially linear relationship in the entire region.

Furthermore, a sixth aspect of the present invention is an amplifier according to the first aspect of the present invention, comprising temperature detecting instrument which detects temperature, wherein said voltage adjusting instrument determines said DC offset voltage on the basis of both of said level control signal and said temperature detected.

Furthermore, a seventh aspect of the present invention is an amplifier of carrying out polar modulation by inputting amplitude data and phase data generated respectively by coding data or signals, comprising:

voltage adjusting instrument which generates an amplitude modulation signal from said amplitude data, a phase modulator of generating a phase modulation signal from said phase data, an amplification device having an input terminal to which said phase modulation signal is input and a power supply terminal to which said amplitude modulation signal is input and outputting a modulation signal subjected to polar modulation using said phase modulation signal input and said amplitude modulation signal input, and temperature detecting instrument which detects temperature, wherein said voltage adjusting instrument determines a DC offset voltage on the basis of said temperature detected and generates said amplitude modulation signal to which said DC offset voltage determined is added.

Furthermore, an eighth aspect of the present invention is an amplifier according to the seventh aspect of the present invention, wherein said voltage adjusting instrument determines said DC offset voltage according to said temperature detected so that the relationship between the voltage level of said modulation signal generated and the voltage level of said amplitude signal becomes a linear relationship at least in part of the region.

Furthermore, a ninth aspect of the present invention is an amplifier according to the eighth aspect of the present invention, wherein said voltage adjusting instrument determines said DC offset voltage by changing said DC offset voltage as a linear function of said temperature detected.

Furthermore, a tenth aspect of the present invention is an amplifier according to the seventh aspect of the present invention, wherein said voltage adjusting instrument changes said DC offset voltage according to said temperature detected so that the relationship between the voltage level of said modulation signal amplified and the voltage level of said amplitude signal becomes a substantially linear relationship in the entire region according to said temperature detected.

Furthermore, an eleventh aspect of the present invention is an amplifier according to the first aspect of the present invention, wherein said amplification device is a heterojunction bipolar transistor.

Furthermore, a twelfth aspect of the present invention is an amplifier according to the eleventh aspect of the present invention, wherein AlGaAs is used for the emitter of said heterojunction bipolar transistor, and GaAs is used for the base thereof, and said voltage adjusting instrument determines said DC offset voltage by changing said DC offset voltage at a rate of 0.20 mV/° C. to 0.70 mV/° C. with respect to said temperature detected.

Furthermore, a thirteenth aspect of the present invention is an amplifier according to the eleventh aspect of the present invention, wherein InGaAs is used for the emitter of said heterojunction bipolar transistor, and GaAs is used for the base thereof, and said voltage adjusting instrument determines said DC offset voltage by changing said DC offset voltage at a rate of 0.20 mV/° C. to 0.80 mV/° C. with respect to said temperature detected.

Furthermore, a fourteenth aspect of the present invention is an amplifier according to the sixth aspect of the present invention, wherein said amplification device is a heterojunction bipolar transistor.

Furthermore, a fifteenth aspect of the present invention is an amplifier according to the fourteenth aspect of the present invention, wherein AlGaAs is used for the emitter of said heterojunction bipolar transistor, and GaAs is used for the base thereof, and said voltage adjusting instrument determines said DC offset voltage by changing said DC offset voltage at a rate of 0.20 mV/° C. to 0.70 mV/° C. with respect to said temperature detected.

Furthermore, a sixteenth aspect of the present invention is an amplifier according to the fourteenth aspect of the present invention, wherein InGaAs is used for the emitter of said heterojunction bipolar transistor, and GaAs is used for the base thereof, and said voltage adjusting instrument determines said DC offset voltage by changing said DC offset voltage at a rate of 0.20 mV/° C. to 0.80 mV/° C. with respect to said temperature detected.

Furthermore, a seventeenth aspect of the present invention is an information communication apparatus comprising:

a transmission circuit of outputting a transmission wave, a reception circuit of receiving a reception wave received by an antenna, an antenna duplexer of leading, to said antenna, said transmission wave output and leading said reception wave received by said antenna to said reception circuit, wherein said amplifier according to the first aspect of the present invention is used in said transmission circuit.

Furthermore, an eighteenth aspect of the present invention is an information communication apparatus comprising:

a transmission circuit of outputting a transmission wave, a reception circuit of receiving a reception wave received by an antenna, an antenna duplexer of leading, to said antenna, said transmission wave output and leading said reception wave received by said antenna to said reception circuit, wherein said amplifier according to the seventh aspect of the present invention is used in said transmission circuit.

Furthermore, a nineteenth aspect of the present invention is an amplification method being used for an amplifier of carrying out polar modulation by inputting amplitude data and phase data generated respectively by coding data or signals, comprising:

a voltage adjusting step of generating an amplitude modulation signal from said amplitude data on the basis of a level control signal indicating the level of said amplitude modulation signal, a phase modulating step of generating a phase modulation signal from said phase data, and an amplifying step of inputting said phase modulation signal from the input terminal of an amplification device, inputting said amplitude modulation signal from the power supply terminal of said amplification device and outputting a modulation signal subjected to polar modulation by said amplification device using said phase modulation signal input and said amplitude modulation signal input, wherein said voltage adjusting step determines a DC offset voltage on the basis of said level control signal and generates said amplitude modulation signal to which said DC offset voltage determined is added.

Furthermore, a twentieth aspect of the present invention is an amplification method being used for an amplifier of carrying out polar modulation by inputting amplitude data and phase data generated respectively by coding data or signals, comprising:

a voltage adjusting step of generating an amplitude modulation signal from said amplitude data, a phase modulating step of generating a phase modulation signal from said phase data, an amplifying step of inputting said phase modulation signal from the input terminal of an amplification device, inputting said amplitude modulation signal from the power supply terminal of said amplification device and outputting a modulation signal subjected to polar modulation by said amplification device using said phase modulation signal input and said amplitude modulation signal input, and a temperature detecting step of detecting temperature, wherein said voltage adjusting step determines a DC offset voltage on the basis of said temperature detected and generates said amplitude modulation signal to which said DC offset voltage determined is added.

The present invention can provide an amplifier, an information communication apparatus and an amplification method capable of significantly reducing the distortion of the modulation signal and capable of suppressing the increase in circuit size and cost.

Furthermore, another aspect of the present invention can provide an amplifier, an information communication apparatus and an amplification method capable of reducing the distortion of the modulation signal owing to the change in the temperature of the amplification device.

DESCRIPTION OF SYMBOLS 101 modulation coder
102 carrier generator
103 amplitude signal linearizer
104 power supply control section
105 offset generation circuit
106 amplification device
107 variable gain amplifier
110 voltage adjusting instrument
111 offset control circuit
401 modulation coder
402 carrier generator
403 amplitude signal linearizer
404 power supply control section
405 offset generation circuit
406 amplification device
407 variable gain amplifier
410 voltage adjusting instrument
411 offset control circuit
701 modulation coder
702 phase signal block
703 amplitude driver
704 amplification device
710 feedback loop
711 amplitude monitor
712 phase monitor
713 modification signal controller

PREFERRED EMBODIMENTS OF THE INVENTION

Embodiments of the present invention will be described below referring to the drawings.

Embodiment 1

First, Embodiment 1 will be described.

Figure 1:
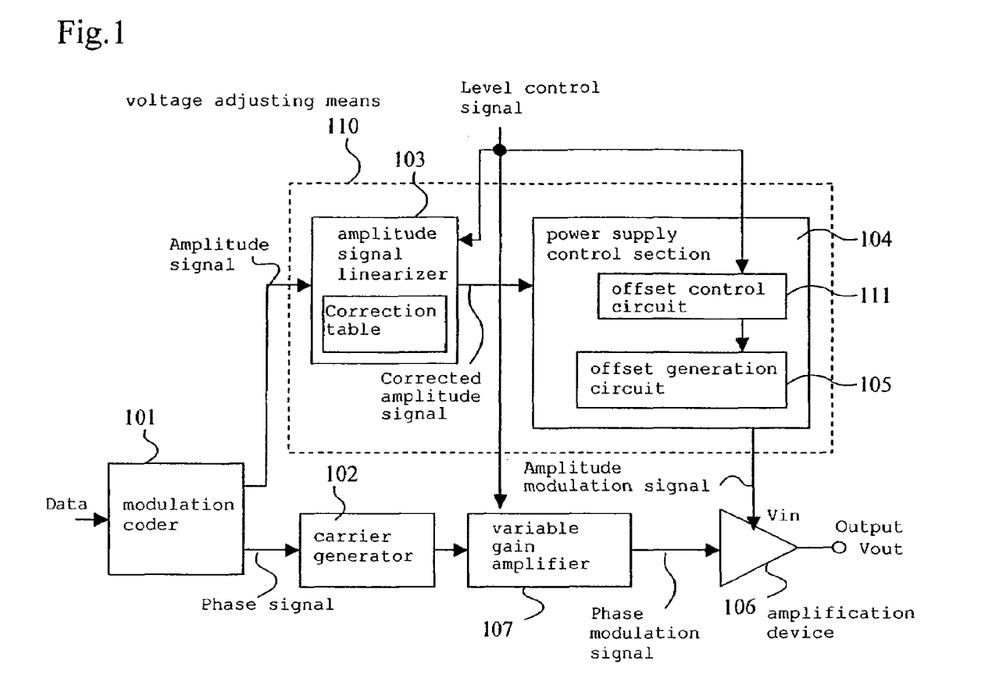
FIG. 1 is a view of the configuration of an amplifier in accordance with Embodiment 1 of the present invention.

FIG. 1 shows the configuration of an amplifier in accordance with Embodiment 1 of the present invention.

The amplifier in accordance with Embodiment 1 comprises a modulation coder 101, a carrier generator 102, a variable gain amplifier 107, a voltage adjusting instrument 110 and an amplification device 106. The voltage adjusting instrument 110 has an amplitude signal linearizer 103 and a power supply control section 104, and the power supply control section 104 has an offset control circuit 111 and an offset generation circuit 105.

One output of the modulation coder 101 is connected to the input of the amplitude signal linearizer 103, and the output of the amplitude signal linearizer 103 is connected to the input of the power supply control section 104. In addition, the output of the power supply control section 104 is connected to the power supply terminal of the amplification device 106, and the output of the amplification device 106 is connected to an output terminal Vout.

On the other hand, the other output of the modulation coder 101 is connected to the input of the carrier generator 102, and the output of the carrier generator 102 is connected to the input of the variable gain amplifier 107. In addition, the output of the variable gain amplifier 107 is connected to the input terminal of the amplification device 106.

Furthermore, the amplitude signal linearizer 103, the power supply control section 104 and the variable gain amplifier 107 each have a terminal (not shown) of receiving a level control signal.

The modulation coder 101 is a circuit of generating a phase signal and an amplitude signal.

The carrier generator 102 is a circuit capable of phase modulation.

The variable gain amplifier 107 is a circuit of adjusting the level of a phase modulation signal.

The amplitude signal linearizer 103 is a circuit of receiving the amplitude signal and the level control signal and correcting the amplitude signal on the basis of correction tables at respective levels of the level control signal.

The power supply control section 104 is a circuit of generating an amplitude modulation signal according to the level control signal and the amplitude signal corrected by the amplitude signal linearizer 103.

The amplification device 106 is a circuit of synthesizing the amplitude modulation signal output from the power supply control section 104 and the phase modulation signal output from the variable gain amplifier 107, simultaneously generating and amplifying a modulation signal, and outputting the signal.

The offset control circuit 111 is a circuit of outputting an offset control signal on the basis of the level control signal. The offset control signal is a signal including information regarding the level of the level control signal.

The offset generation circuit 105 is a circuit of determining a DC offset voltage that is added to the amplitude modulation signal applied to the power supply terminal of the amplification device 106 according to the offset control signal output from the offset control circuit 111.

In other words, the offset generation circuit 105 is a circuit of determining the DC offset voltage according to the level of the level control signal and outputting a signal obtained by adding the DC offset voltage to the amplitude modulation signal as the amplitude modulation signal.

Next, the operation of Embodiment 1 having this configuration will be described.

First, data, such as sound, characters and images, is input to the modulation coder 101 of generating the phase signal and the amplitude signal.

The data in accordance with this embodiment is signals transmitted using a bus line comprising multiple signal lines including at least one signal line of transmitting a clock signal in synchronization with the clock signal, and means signals indicating discrete numeric values. Hence, the data, such as sound, characters and images, to be input to the modulation coder 101 is information, such as sound information, character information and image information, represented by discrete numeric values, and means signals to be input from the bus line to the modulation coder 101 in synchronization with the clock signal.

The modulation coder 101 codes the input data and generates and outputs amplitude data and phase data. The amplitude data and the phase data output from the modulation coder 101 are also the data described above.

The phase signal output from one of the outputs of the modulation coder 101 is input to the carrier generator 102 capable of phase modulation. The carrier generator 102 generates a phase modulation signal by carrying out phase modulation using the phase signal input and a carrier generated by a local oscillator not shown, and outputs the phase modulation signal generated. The phase modulation signal generated by the carrier generator 102 is not the data described above but an electrical signal having voltages corresponding to discrete numeric values indicated by the phase signal serving as data.

The phase modulation signal output from the carrier generator 102 is input to the variable gain amplifier 107. The variable gain amplifier 107 adjusts the level of the phase modulation signal input. Then, the phase modulation signal, the level of which is adjusted, is output to the input terminal of the amplification device 106.

On the other hand, the amplitude signal output from the other output of the modulation coder 101 is input to the voltage adjusting instrument 110. The voltage adjusting instrument 110 receives the amplitude signal and also receives the level control signal simultaneously, and generates an amplitude modulation signal according to the amplitude signal input and the level control signal input. Then, the voltage adjusting instrument 110 outputs the amplitude modulation signal generated to the power supply terminal of the amplification device 106.

As shown in FIG. 1, the voltage adjusting instrument 110 comprises the amplitude signal linearizer 103 having the correction tables and the power supply control section 104 having the offset generation circuit 105. The operation of the voltage adjusting instrument 110 will be described in more detail while paying attention to this point.

In other words, the amplitude signal linearizer 103 receives the amplitude signal output from the other output of the modulation coder 101 and also receives the level control signal. The level control signal is a signal of controlling the output level of the amplifier. More specifically, the level control signal is conventionally used only to adjust the level of the amplitude modulation signal that is input to the input terminal of the amplification device 106. However, in Embodiment 1, the level control signal is used not only for the adjustment of the level of the amplitude modulation signal as a matter of course but also for other uses.

In other words, the amplitude signal linearizer 103 has the correction tables for correcting the amplitude signal for respective levels of the level control signal as described above. That is to say, the amplitude signal linearizer 103 has multiple correction tables. The amplitude signal linearizer 103 selects a correction table corresponding to the level indicated by the level control signal from among the multiple correction tables corresponding to respective levels of the amplitude control signal, and corrects the amplitude signal on the basis of the selected correction table. The amplitude signal corrected by the amplitude signal linearizer 103 is output to the power supply control section 104.

The power supply control section 104 receives the amplitude signal corrected by the amplitude signal linearizer 103 and also receives the level control signal. The power supply control section 104 generates an amplitude modulation signal according to the level control signal and the corrected amplitude signal. The amplitude modulation signal is an electrical signal having voltages corresponding to the numerical values indicated by the corrected amplitude signal and serving as data. When the power supply control section 104 generates the amplitude modulation signal, the offset generation circuit 105 receives the offset control signal indicating the level of the level control signal from the offset control circuit 111 and determines the DC offset voltage according to the offset control signal. The power supply control section 104 then generates the DC offset voltage determined by the offset generation circuit 105, and the power supply control section 104 outputs a signal obtained by adding the DC offset voltage to the amplitude modulation signal as the amplitude modulation signal, thereby driving the power supply of the amplification device 106. As described above, the amplifier in accordance with Embodiment 1 also uses the level control signal to determine the DC offset voltage.

In the amplification device 106, the amplitude modulation signal output from the power supply control section 104 is synthesized with the phase modulation signal output from the variable gain amplifier 107, and a modulation signal subjected to polar modulation is generated. Then, the amplification device 106 generates the modulation signal subjected to polar modulation, and amplifies and outputs the modulation signal.

Figure 2A:
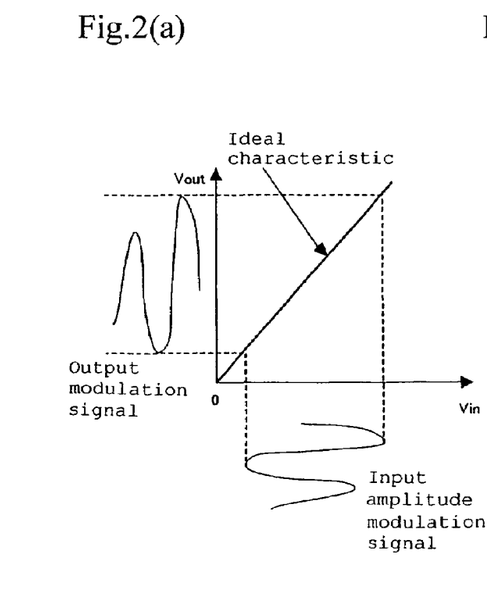
FIG. 2(a) is a view showing the ideal relationship between the collector voltage and the output voltage of a heterojunction bipolar transistor.
Figure 2B:
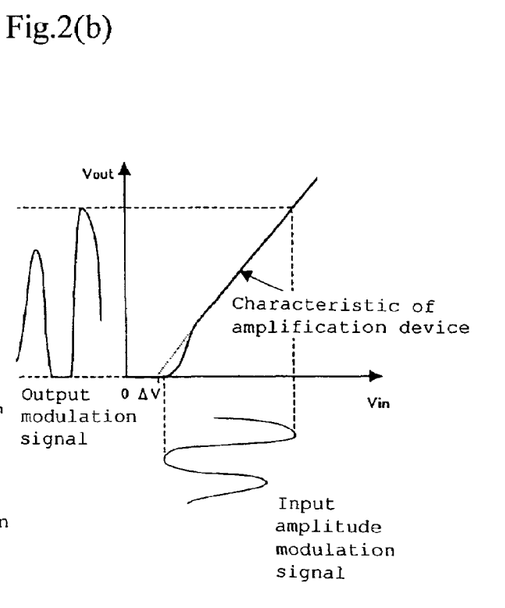
FIG. 2(b) is a view showing the relationship between the collector voltage and the output voltage of the heterojunction bipolar transistor.

FIG. 2 shows the relationship between the power supply voltage Vin and the output voltage Vout of the amplification device 106 shown in FIG. 1. FIG. 2(*a*) shows the ideal linear characteristic of the amplification device 106, indicating that the modulation signal is output without distortion with respect to the amplitude modulation signal input. In FIG. 2(*b*), it is assumed that the amplification device 106 is a power amplifier comprising multistage-connected heterojunction bipolar transistors, that a sufficiently large phase modulation signal is input so as to be in a saturation operation state, and that the power supply voltage Vin is applied to the collector terminal. When the collector voltage Vin becomes larger than a certain voltage $\Delta V$, the output voltage Vout begins to increase and then increases nearly proportionately to the collector voltage Vin. The voltage $\Delta V$ is owing to the conduction band discontinuity in the heterojunction sections of the heterojunction bipolar transistors. In addition, when the output voltage Vout is low, the voltage is not completely proportionate to the collector voltage Vin. In these two points, the characteristic of the amplification device 106 deviates from the linear characteristic. If an amplitude modulation signal not modified at all is input to the amplification device 106, the modulation signal to be output is distorted, resulting in the increase in adjacent channel leakage power and the deterioration of modulation accuracy.

Figure 3A:
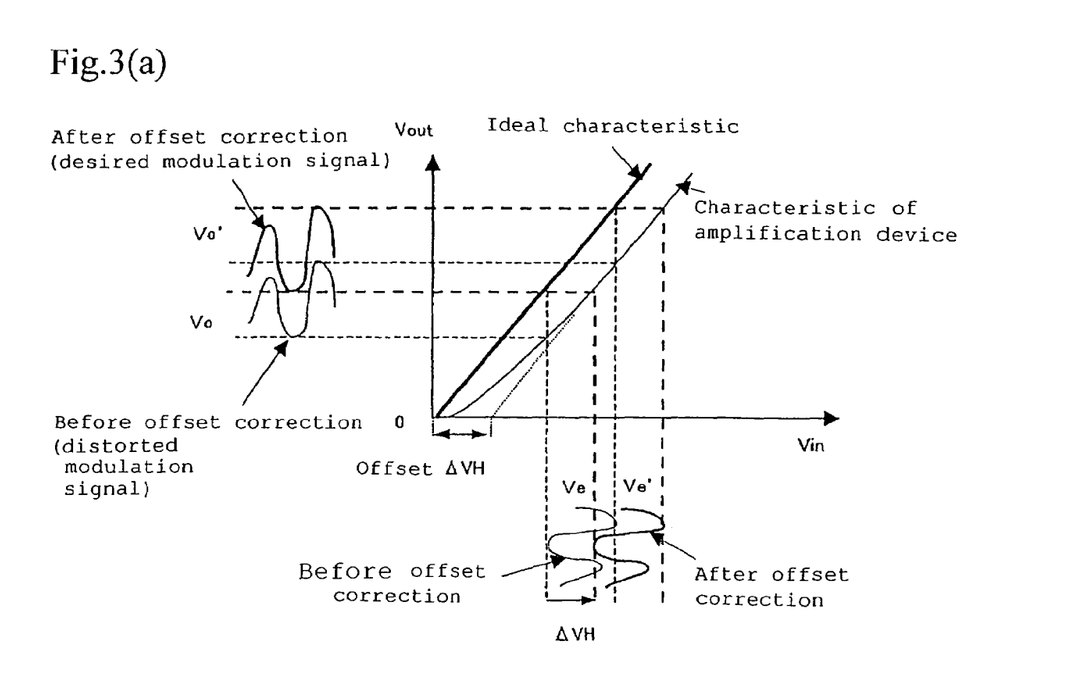
FIG. 3(a) is a view showing the amplitude operation region of the heterojunction bipolar transistor after correction in the amplifier in accordance with Embodiment 1 of the present invention ((a) in the case that the level control signal is large)
Figure 3B:
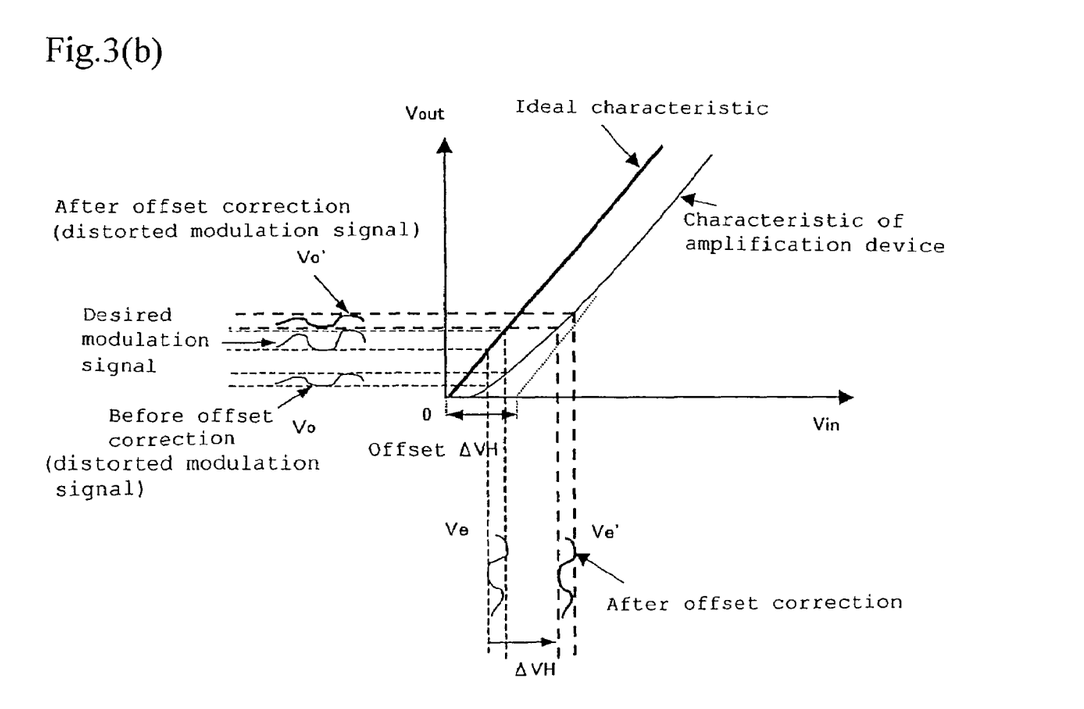
FIG. 3(b) is a view showing the amplitude operation region of the heterojunction bipolar transistor after correction in the amplifier in accordance with Embodiment 1 of the present invention ((b) in the case that the level control signal is small and that the level of the phase modulation signal is sufficiently large)
Figure 3C:
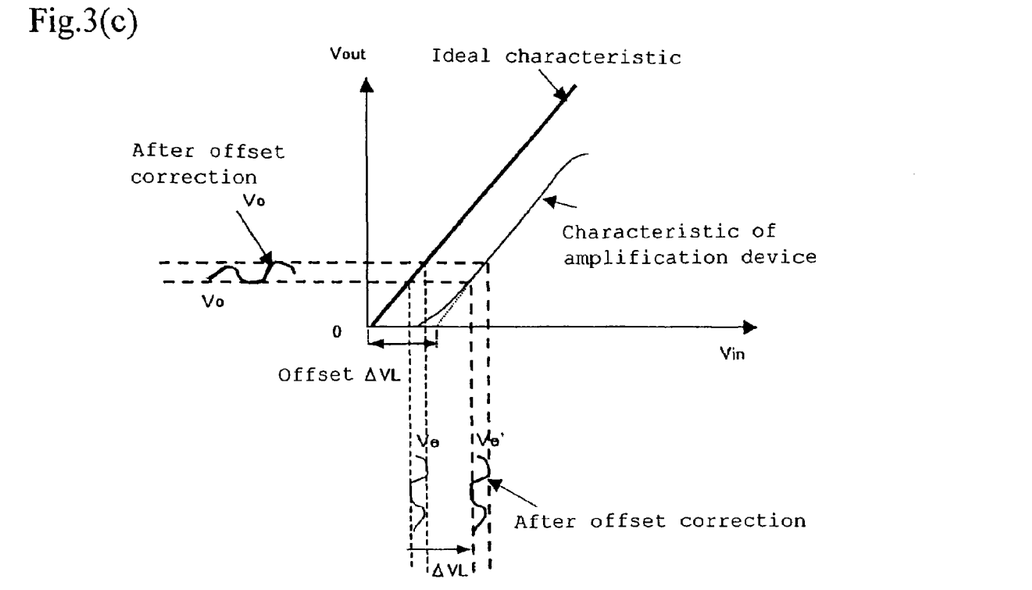
FIG. 3(c) is a view showing the amplitude operation region of the heterojunction bipolar transistor after correction in the amplifier in accordance with Embodiment 1 of the present invention ((c) in the case that the level control signal is small and that the level of the phase modulation signal is sufficiently small)

FIGS. 3(*a*), 3(*b*) and 3(*c*) show the principle of correcting the modulation signal of Embodiment 1 in the case that the level control signal is large and the case that the signal is small.

FIG. 3(*a*) shows the relationship between the amplitude modulation signal input to the collector terminal and the modulation signal output therefrom in the case that the level control signal is large. If the input amplitude modulation signal Ve is directly input to the amplification device 106, an output modulation signal Vo less distorted than the desired output modulation signal Vo' is output. Hence, the amplitude modulation signal Ve' obtained by adding the DC offset voltage $\Delta VH$ determined by the offset generation circuit 105 to the amplitude modulation signal Ve is applied to the collector, whereby the desired modulation signal Vo' is output. As a result, the amplitude modulation signal Ve' input and the modulation signal Vo' output have a nearly linear relationship, and the modulation signal Vo' output from the amplification device 106 is not distorted.

On the other hand, FIG. 3(*b*) corresponds to the case that the level control signal is small. The output modulation signal Vo' obtained in the case that Ve' obtained by adding the DC offset voltage $\Delta VH$ determined by the offset generation circuit 105 to the amplitude modulation signal Ve is applied is different from the desired voltage Vo obtained from the ideal characteristic. This is because the power supply voltage Vin and the output voltage Vout of the amplification device 106 do not have a proportionate relationship in the operation region.

Hence, the level of the phase modulation signal to be input from the variable gain amplifier 107 to the amplification device 106 is lowered so that the input to the amplification device is lowered. As a result, in the characteristic of the amplification device, the DC offset voltage changes to $\Delta VL$, and the lowest level of Vin at which Vout begins to be generated is also lowered. The fact that the characteristic of the amplification device 106 changes as described above when the level of the phase modulation signal to be input to the input terminal of the amplification device 106 is lowered is a fact originally found in the present invention. As a result, when the amplitude modulation signal Ve' obtained by adding the DC offset voltage ΔVL to the amplitude modulation signal Ve to be input is input to the collector, the collector voltage Vin and the output voltage Vout have a nearly linear relationship in the variation range of the amplitude modulation signal Ve', whereby the modulation signal output from the amplification device 106 is not distorted, and the desired Vo' is obtained.

As described above, the distortion of the modulation signal output from the amplification device 106 can be reduced significantly by changing the DC offset voltage of the amplitude modulation signal output from the power supply control section 104 while changing the input level of the phase modulation signal input to the amplification device 106 according to the level of the output modulation signal.

Hence, in the conventional amplifier shown in FIG. 7, for the purpose of reducing the distortion of the modulation signal output from the amplification device 704, it is necessary to provide the feedback loop 710; however, in the amplifier of Embodiment 1, the distortion output from the amplification device 106 can be reduced simultaneously without providing the feedback loop 710.

In the conventional amplifier shown in FIG. 7, the modification signal controller 713 is provided with correction tables, and in the amplifier of Embodiment 1, the amplitude signal linearizer 103 is provided with correction tables; the two are similar in that they are provided with correction tables. However, in Embodiment 1, although the offset generation circuit 105 and other circuits are required additionally, the increase in circuit size owing to these additional circuits is very small; on the other hand, by the provision of the offset generation circuit 105, the memory amount required for the correction tables of the amplitude signal linearizer 103 can be made sufficiently small, thereby being effective in that the circuit size can be made smaller than that of the conventional example when the total circuit size is considered.

As described above, the amplifier of Embodiment 1 can have the effects capable of significantly reducing the distortion output from the amplification device and capable of reducing circuit size.

In Embodiment 1, it is described that the variable gain amplifier 107 is provided between the carrier generator 102 and the amplification device 106; however, the embodiment is not limited to this. Without providing the variable gain amplifier 107 between the carrier generator 102 and the amplification device 106, the output of the carrier generator 102 may be connected to the input terminal of the amplification device 106. Even in this case, the distortion of the modulation signal output from the amplification device 106 can be reduced significantly.

In addition, in Embodiment 1, it is described that the modulation coder 101 generates the amplitude signal and the phase signal by receiving data and by coding the input data; however, the embodiment is not limited to this. The modulation coder 101 may generate the amplitude signal and the phase signal by receiving an analog signal indicating sound, images, etc., by converting the analog signal into data once and then by coding the converted data.

Furthermore, in Embodiment 1, it is described that the offset generation circuit 105 changes the DC offset voltage according to the level control signal; however, the embodiment is not limited to this. In the case that the level control signal is smaller than a predetermined value, the power of the output signal from the amplification device 106 also becomes small. In the case that the power of the output signal is small as described above, no problem occurs even if the output signal from the amplification device 106 is distorted to some extent. Hence, it may be possible that, in the case that the level control signal is smaller than the predetermined value, the function of the offset generation circuit 105 is stopped, and that, in the case that the level control signal is equal to or larger than the predetermined value, the offset generation circuit 105 is operated.

Moreover, in Embodiment 1, it is described that the amplifier is provided with the amplitude signal linearizer 103; however, the amplifier may be configured so as not to be provided with the amplitude signal linearizer 103. In particular, in the case that the amplification device 106 can be operated in its linear region only by changing the DC offset voltage of the amplification device 106, it is not necessary to use the amplitude signal linearizer 103. Hence, in this case, an effect similar to that of Embodiment 1 can be obtained even in the case that the amplifier does not use the amplitude signal linearizer 103.

Besides, in Embodiment 1, it is described that the offset control circuit 111 receives the level control signal and outputs the offset control signal indicating the level of the level control signal; however, the embodiment is not limited to this. It may be possible that, without providing the offset control circuit 111, the level control signal is directly input to the offset generation circuit 105, and that the offset generation circuit 105 determines the DC offset voltage on the basis of the level control signal input.

Still further, the amplitude signal of this embodiment is an example of amplitude data of the present invention, and the phase signal of this embodiment is an example of phase data of the present invention.

Embodiment 2

Next, Embodiment 2 will be described.

Figure 4:
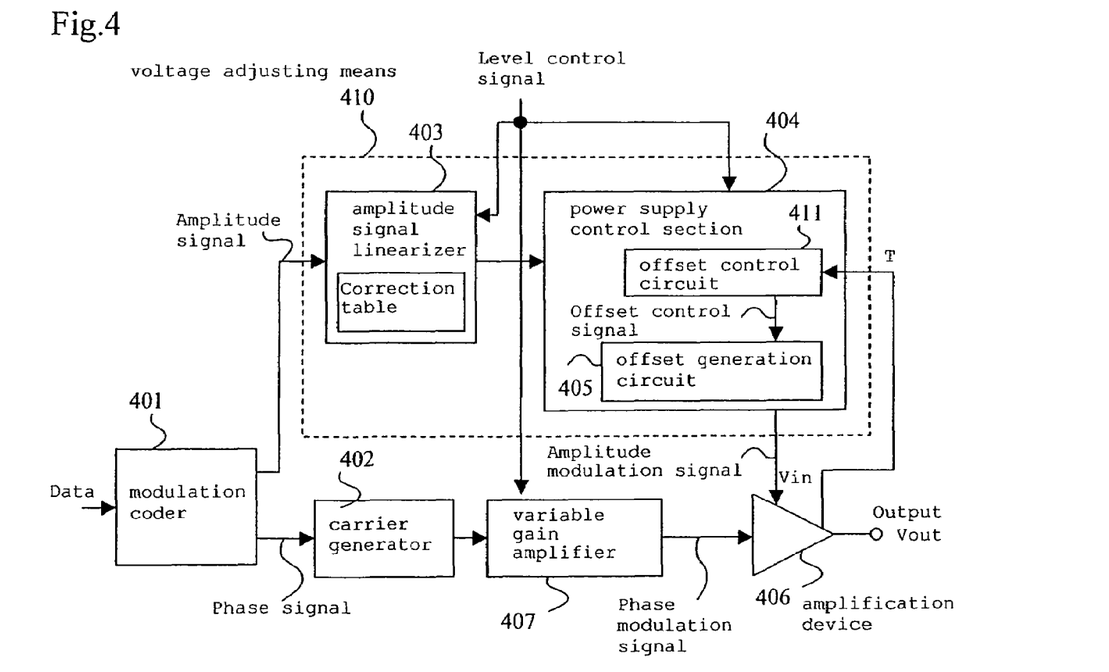
FIG. 4 is a view of the configuration of an amplifier in accordance with Embodiment 2 of the present invention.

FIG. 4 shows the configuration of an amplifier in accordance with Embodiment 2 of the present invention.

The amplifier shown in FIG. 4 differs from the amplifier of Embodiment 1 shown in FIG. 1 in that a power supply control section 404 comprises an offset control circuit 411 and an offset generation circuit 405 and has a function of monitoring the temperature of an amplification device 406.

More specifically, the offset control circuit 411 is a circuit having a function of monitoring the temperature T of the amplification device 406. In other words, the offset control circuit 411 is a circuit of outputting an offset control signal on the basis of the signal from a temperature sensor of detecting the temperature of the amplification device 406. The offset control signal is a signal including information regarding the temperature of the amplification device 406.

In addition, the offset generation circuit 405 is a circuit of determining the DC offset voltage that is added to the amplitude modulation signal applied to the power supply terminal of the amplification device 406 according to the offset control signal output from the offset control circuit 411.

Since the amplifier of Embodiment 2 is similar to the amplifier of Embodiment 1 except for the matters described above, its description is omitted.

The function of monitoring the temperature T of the amplification device 406, included in the offset control circuit 411 of Embodiment 2, is an example of the temperature detecting instrument of the present invention.

The modulation coder 401, the carrier generator 402, the amplitude signal linearizer 403 and the variable gain amplifier 407 are the same as the modulation coder 101, the carrier generator 102, the amplitude signal linearizer 103 and the variable gain amplifier 107 of Embodiment 1 shown in FIG. 1, respectively. Furthermore, the amplitude signal linearizer 403 and the power supply control section 404 form a voltage adjusting instrument 410.

Next, the differences between the operation of Embodiment 2 described above and that of Embodiment 1 will be described mainly.

Instead of determining the DC offset voltage applied to the internal amplitude signal on the basis of the level control signal as in the case of the amplifier of Embodiment 1, the amplifier in accordance with Embodiment 2 determines the DC offset voltage according to the temperature of the amplification device 406.

In other words, the offset control circuit 411 receives a signal from a temperature sensor, not shown, of detecting the temperature of the amplification device 406 and outputs an offset control signal indicating the temperature of the temperature sensor to the offset generation circuit 405.

The offset generation circuit 405 determines the DC offset voltage according to the offset control signal. Then, the power supply control section 404 applies this finally determined DC offset voltage to the internal amplitude signal.

As described above, the power supply control section 404 of Embodiment 2 determines the DC offset voltage according to the temperature of the amplification device 406, applies the determined DC offset voltage to the internal amplitude signal and outputs a generated amplitude signal.

Figure 5:
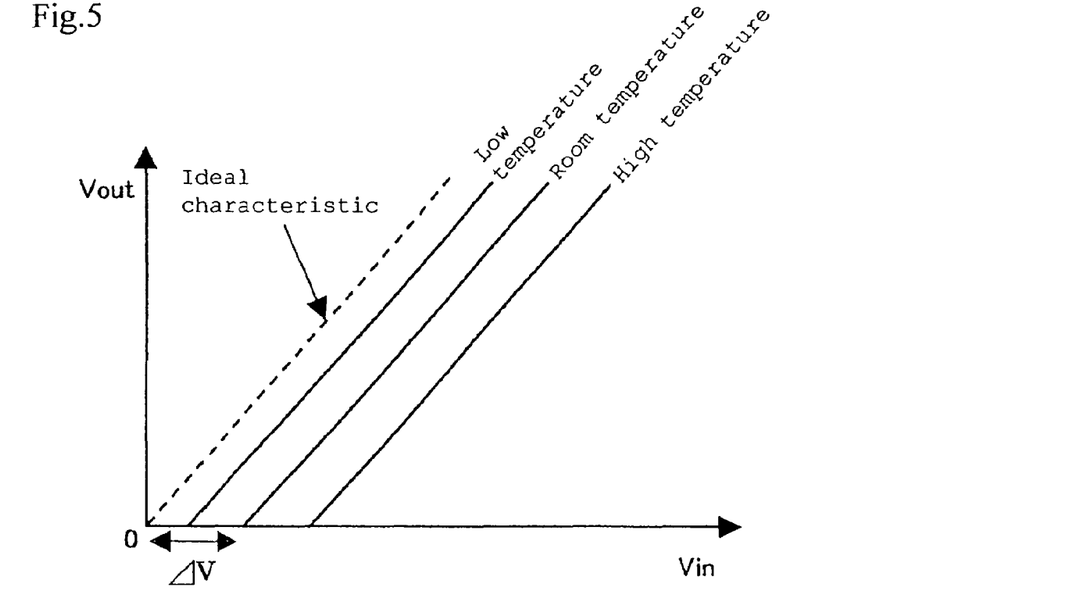
FIG. 5 is a view showing the relationship between the collector voltage and the output voltage of the heterojunction bipolar transistor at the time of temperature change.

FIG. 5 shows the relationship between the collector voltage Vin and the output voltage Vout of the amplification device 406 at the time when the temperature of the amplification device 406 changes in the case that the amplification device 406 shown in FIG. 4 is a single-stage heterojunction bipolar transistor. When the collector voltage Vin becomes larger than a certain threshold voltage, the output voltage Vout begins to increase and then increases nearly proportionately to the collector voltage; however, the threshold voltage $\Delta V$ changes according to the temperature. The amount of change in $\Delta V$ with respect to the temperature differs depending on the materials to be used for the collector and the base of the heterojunction bipolar transistor. In the case that AlGaAs is used for the emitter and that GaAs is used for the base, it is known that $\Delta V$ changes at approximately 0.2 to 0.7 mV/° C., and in the case that InGaAs is used for the emitter and that GaAs is used for the base, it is known that $\Delta V$ changes at approximately 0.2 to 0.8 mV/° C.

Figure 6:
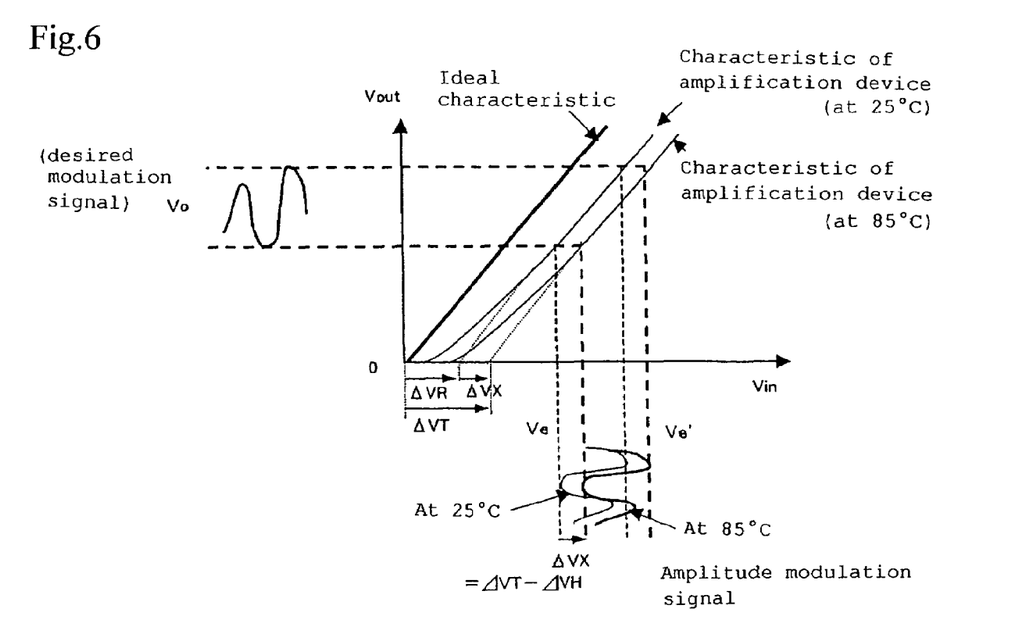
FIG. 6 is a view showing the amplitude operation region of the heterojunction bipolar transistor after correction in the amplifier in accordance with Embodiment 2 of the present invention.

FIG. 6 shows the principle of correcting the output voltage Vout of Embodiment 2 when the temperature is room temperature and when the temperature is high temperature in the case that the amplification device 406 is a heterojunction bipolar transistor wherein AlGaAs is used for the emitter and GaAs is used for the base.

In the case that the amplification device 406 has a room temperature of 25° C., the amplitude modulation signal Ve obtained by adding 0.2 V serving as the DC offset voltage $\Delta VR$ determined by the offset generation circuit 405 of the power supply control section 404 to the amplitude modulation signal is applied to the collector voltage Vin of the amplification device 406. As a result, the collector voltage Vin and the output voltage Vout of the amplification device 406 have a completely linear relationship coincident with the ideal characteristic, whereby the output modulation signal Vo is not distorted.

On the other hand, in the case of high temperature, the offset voltage of the amplification device 406 changes at a rate of 0.6 mV/° C., and in the case of a high temperature of 85° C., the voltage changes +36 mV as $\Delta Vx$. As the DC offset voltage $\Delta VT$ determined by the offset generation circuit 405, 0.236 V obtained by adding $\Delta Vx$, +36 mV, to $\Delta VR$, 0.2 V, is added to the amplitude modulation signal. As a result, the amplitude modulation signal Ve' is applied as the collector voltage Vin of the amplification device 406, the collector voltage Vin and the output voltage Vout of the amplification device 406 have a completely linear relationship coincident with the ideal characteristic, whereby the output modulation signal Vo is not distorted.

As described above, the DC offset voltage is added to the amplitude modulation signal according to the temperature of the amplification device 406 and the amplitude modulation signal to which the DC offset voltage is added is applied to the collector voltage Vin of the amplification device 406, whereby the distortion of the modulation signal output from the amplification device 406 can be reduced significantly at all times even if the temperature changes. Since the shift amount of the offset owing to the temperature change is nearly proportionate, the DC offset generated by the offset generation circuit 405 should only change in proportion to the temperature T of the amplification device 406, and it is not necessary to have complicated reference tables. Regarding the DC offset change amount generated by the offset generation circuit 405, $\Delta V$ should only be set at approximately 0.2 to 0.7 mV/° C. in the case that AlGaAs is used for the emitter of the heterojunction bipolar transistor and that GaAs is used for the base thereof, and $\Delta V$ should only be set at approximately 0.2 to 0.8 mV/° C. in the case that InGaAs is used for the emitter and that GaAs is used for the base.

In Embodiment 2, it is described that the offset control circuit 411 has a function of monitoring the temperature T of the amplification device 406; however, the embodiment is not limited to this. Instead of monitoring the temperature T of the amplification device 406, the offset control circuit 411 may monitor the temperature detected by a temperature sensor provided inside the housing of an information communication apparatus in which the amplifier of Embodiment 2 is used. In other words, instead of monitoring the temperature of the amplification device 406, the offset control circuit 411 may monitor the temperature inside the housing of the information communication apparatus in which the amplifier of Embodiment 2 is used. More specifically, it is ideal to accurately detect the temperature of the amplification device 406; however, in reality, it is difficult to install the temperature sensor so as to make direct contact with the amplification device 406 in many cases owing to restrictions in space on a circuit board on which the amplifier is mounted. Even in such cases, an effect similar to that of Embodiment 2 can also be obtained by installing the temperature sensor in the space remaining inside the housing, by detecting the temperature inside the housing and by carrying out the above-mentioned operation under the assumption that the detected temperature is the temperature T of the amplification device 406.

In addition, in Embodiment 2, it is described that the variable gain amplifier 407 is provided between the carrier generator 402 and the amplification device 406; however, the embodiment is not limited to this. Without providing the variable gain amplifier 407 between the carrier generator 402 and the amplification device 406, the output of the carrier generator 402 may be connected to the input terminal of the amplification device 406. Even in this case, the distortion of the modulation signal output from the amplification device 406 can be reduced significantly.

Furthermore, in Embodiment 2, it is described that the offset generation circuit 405 changes the DC offset voltage according to the level control signal; however, the embodiment is not limited to this. In the case that the level control signal is smaller than a predetermined value, the power of the output signal from the amplification device 406 also becomes small. In the case that the power of the output signal is small as described above, no problem occurs even if the output signal from the amplification device 406 is distorted to some extent. Hence, it may be possible that, in the case that the level control signal is smaller than the predetermined value, the function of the offset generation circuit 405 is stopped, and that, in the case that the level control signal is equal to or larger than the predetermined value, the offset generation circuit 105 is operated.

As described above, with this embodiment, even in the case that the nonlinearity of the amplification device with respect to the amplitude modulation signal is large, the correction amount with respect to the amplitude modulation signal can be reduced significantly. Moreover, it is possible to suppress the increase in circuit size and cost.

The respective embodiments have been described while paying attention to the amplitude signal, but the correction of the phase signal is not described. The correction of the phase signal is required according to operation conditions and the like; in that case, a conventional method of correcting the phase signal should only be applied to the configurations of the respective embodiments. For example, the section of correcting the phase signal in the conventional configuration shown in FIG. 7 can be applied to the configurations of the embodiments shown in FIGS. 1 and 4.

Furthermore, in the respective embodiments, the amplifier carrying out polar modulation is described; however, the present invention is also applicable to amplifiers that carry out modulation methods other than polar modulation.

Still further, it may also possible that the amplifier of Embodiment 1 is provided with the function of monitoring the temperature of the amplification device, described in Embodiment 2, and that the DC offset voltage is determined on the basis of both the level control signal and the temperature of the amplification device. Usually, the DC offset change amount generated by the offset generation circuit 405 also changes according to the output level of the variable gain amplifier 407, and the DC offset change amount is set independently of the temperature T of the amplification device 406. In the case that the output level of the variable gain amplifier 407 changes extremely, it is effective to change the DC offset change amount with respect to temperature in the range described above.

Embodiment 3

Next, Embodiment 3 will be described.

In Embodiment 3, an information communication apparatus that uses the amplifier described in Embodiment 1 or Embodiment 2 will be described.

Figure 8:
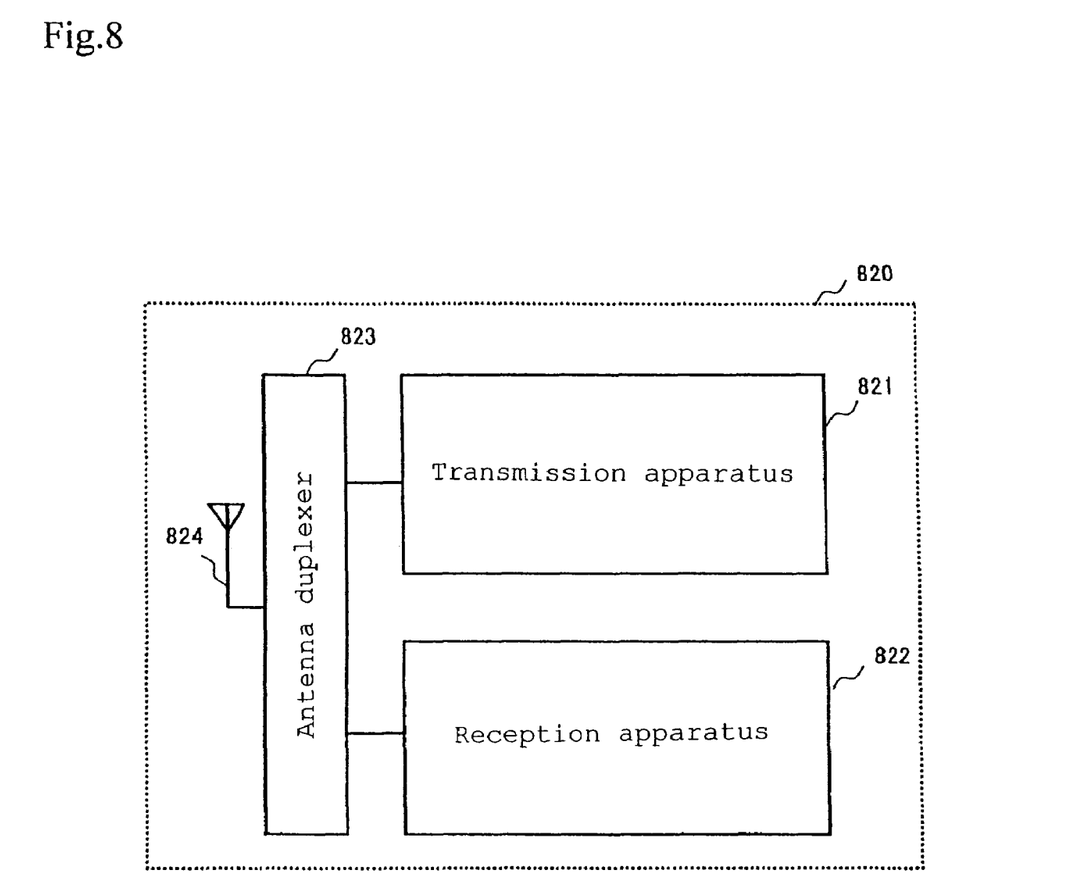
FIG. 8 is a view of the configuration of an information communication apparatus in accordance with Embodiment 3 of the present invention.

FIG. 8 is a block diagram showing the general configuration of an information communication apparatus 820 including the amplifier described in Embodiment 1 and shown in FIG. 1 or the amplifier described in Embodiment 2 and shown in FIG. 4. The information communication apparatus 820 comprises a transmission apparatus 821 and a reception apparatus 822, these being connected to an antenna 824 via an antenna duplexer 823. The amplifier described in Embodiment 1 or the amplifier described in Embodiment 2 is used for the transmission apparatus 821. Portable wireless terminal apparatuses, such as portable telephones and portable information terminals equipped with a communication function, wireless base stations, etc. are herein included as the information communication apparatus 820. Furthermore, the information communication apparatus 820 may be transmission cards, such as a PDA and a wireless LAN.

Next, the operation of this embodiment will be described.

During transmission, the transmission apparatus 821 receives data, such as sound, characters and images, from a base band section not shown. The data input is further input to the amplifier described in Embodiment 1 or Embodiment 2. The data is then subjected to polar modulation using the amplifier of Embodiment 1 or Embodiment 2 that is used in the transmission apparatus 821, and a modulation signal subjected to polar modulation is output. The transmission apparatus 821 outputs the output modulation signal to the antenna duplexer 823 as a transmission signal. The antenna duplexer 823 leads the transmission signal output from the transmission apparatus 821 to the antenna 824, and the transmission signal led to the antenna 824 is radiated from the antenna 824 into the air.

On the other hand, during reception, the reception signal received by the antenna 824 is led to the reception apparatus 822 via the antenna duplexer 823. The reception apparatus 822 receives the reception signal from the antenna duplexer 823, and demodulates the signal into a base band signal. Then, the reception apparatus 822 outputs the demodulated base band signal to the base band section not shown.

As described above, by the use of the amplifier described in Embodiment 1 or Embodiment 2 for the information communication apparatus of Embodiment 3, it is possible to realize an information communication apparatus capable of transmitting a modulation signal, the distortion of which is reduced significantly.

The amplifier, information communication apparatus and amplification method in accordance with the present invention have effects capable of significantly reducing the distortion of a modulation signal and suppressing the increase in circuit size and cost, and are useful for amplifiers, information communication apparatuses and amplification methods that carry out polar modulation, and particularly useful for amplifiers, information communication apparatuses and amplification methods that operate at high frequencies and carry out polar modulation.

Furthermore, the amplifier, information communication apparatus and amplification method in accordance with the present invention have an effect capable of reducing the distortion of the modulation signal owing to the change in the temperature of the amplification device, and are useful for amplifiers, information communication apparatuses and amplification methods that carry out polar modulation, and particularly useful for amplifiers, information communication apparatuses and amplification methods that operate at high frequencies and carry out polar modulation.

What is claimed is:

1. An amplifier of carrying out polar modulation by inputting amplitude data and phase data generated respectively by coding data or signals, comprising:
   a phase modulator of generating a phase modulation signal from the phase data;
   a gain adjusting instrument of determining the output level of the phase modulation signal on the basis of a level control signal indicating the level of an amplitude modulation signal, and adjusting the level of the phase modulation signal so that the phase modulation signal has the output level;
   a voltage adjusting instrument of determining a DC offset value on the basis of the amplitude data and the level control signal which is used for adjustment of the level of the phase modulation signal, and generating the amplitude modulation signal to which the DC offset value is added; and an amplification device having an input terminal to which the phase modulation signal is input and a power supply terminal to which the amplitude modulation signal is input, and generating a modulation signal subjected to polar modulation using the phase modulation signal input and the amplitude modulation signal input, wherein the DC offset value is determined so that in the amplification device the relationship between the modulation signal generated and the amplitude modulation signal becomes a linear relationship at least in a part of a region of a characteristic of the amplification device.

2. The amplifier according to claim 1, further comprising: a temperature detecting instrument which detects temperature, wherein the voltage adjusting instrument determines the DC offset voltage on the basis of both of the level control signal and the temperature detected.

3. The amplifier according to claim 1, wherein the amplification device is a heterojunction bipolar transistor.

4. The amplifier according to claim 3, wherein: AlGaAs is used for the emitter of the heterojunction bipolar transistor, and GaAs is used for the base thereof, and the voltage adjusting instrument determines the DC offset voltage by changing the DC offset voltage at a rate of 0.20 mV/° C. to 0.70 mV/° C. with respect to the temperature detected.

5. The amplifier according to claim 3, wherein InGaAs is used for the emitter of the heterojunction bipolar transistor, and GaAs is used for the base thereof, and the voltage adjusting instrument determines the DC offset voltage by changing the DC offset voltage at a rate of 0.20 mV/° C. to 0.80 mV/° C. with respect to the temperature detected.

6. An information communication apparatus comprising: a transmission circuit of outputting a transmission wave, a reception circuit of receiving a reception wave received by an antenna, an antenna duplexer of leading, to the antenna, the transmission wave output and leading the reception wave received by the antenna to the reception circuit, wherein the amplifier according to claim 1 is used in the transmission circuit.

7. An amplification method being used for an amplifier of carrying out polar modulation by inputting amplitude data and phase data generated respectively by coding data or signals, comprising:

generating a phase modulation signal from the phase data;

determining the output level of the phase modulation signal on the basis of a level control signal indicating the level of an amplitude modulation signal, and adjusting the level of the phase modulation signal so that the phase modulation signal generated has the output level;

determining a DC offset value on the basis of the amplitude data and the level control signal which is used for adjustment of the level of the phase modulation signal, and generating the amplitude modulation signal to which the DC offset value is added; and generating a modulation signal subjected to polar modulation using the phase modulation signal input and the amplitude modulation signal, wherein the DC offset value is determined so that in generation of the modulation signal the relationship between the modulation signal generated and the amplitude modulation signal becomes a linear relationship at least in a part of a region of a characteristic of the amplification.

8. The amplification method according to claim 7, comprising:

detecting temperature; and determining the DC offset voltage on the basis of both of the level control signal and the temperature detected.

* * * * *